United States Patent [19]

Levinson

[11] Patent Number: 4,656,438

[45] Date of Patent: Apr. 7, 1987

[54] POWER COMBINING CAVITY

[75] Inventor: Samuel Levinson, Norwalk, Conn.

[73] Assignee: United Technologies Corporation, Hartford, Conn.

[21] Appl. No.: 590,935

[22] Filed: Mar. 19, 1984

[51] Int. Cl.[4] ............................................... H03F 3/60
[52] U.S. Cl. ..................................... 330/287; 330/56; 331/107 DP; 331/107 P
[58] Field of Search ...................... 330/53, 56, 68, 287; 331/107 DP, 107 P, 107 SL, 107 C; 333/136, 137, 230, 231, 232

[56] References Cited

U.S. PATENT DOCUMENTS 3,662,285 5/1972 Rucker ............................ 331/107 P

FOREIGN PATENT DOCUMENTS 2758943 7/1978 Fed. Rep. of Germany ... 331/107 P

OTHER PUBLICATIONS

Huish et al., "A 10 W IMPATT Diode Amplifier for X-band Communication Systems", Conference: Proceedings of the Ninth European Microwave Conference, Microwave 79, Brighton, England, Sep. 17–20, 1979.

Primary Examiner—James B. Mullins
Attorney, Agent, or Firm—Gerald E. Linden; Robert P. Sabath

[57] ABSTRACT

A method and arrangement for enhancing the level of supplied microwave energy including a resonant ring capacitively coupled to a microwave coupling device effective for connecting to a microwave transmission line, the arrangement being mounted in a shield structure. Amplification is effected by IMPATT diodes capacitively coupled to the resonant ring. The microwave coupling device is variably setable with respect to the transfer structure, thereby promoting the establishment of impedance matching therebetween.

4 Claims, 7 Drawing Figures

POWER COMBINING CAVITY

TECHNICAL FIELD

This invention relates to the art of solid state microwave wavelength power combination and amplification devices as are, for example, employable in transmitters for radar and communication systems. More particularly, the invention relates to the art of solid state microstrip millimeter wavelength power combiners and cavities, for minimizing losses in the amplification of microwave power. The art includes the technology of IMPATT or other negative resistance diode devices and components.

BACKGROUND ART

For some time, the microwave and radar arts have been hampered by the power limitations of devices and components for the effective, minimally lossy and economical transfer, amplification, combination and subdivision of microwave power. For example, the mere transportation of microwave energy in many applications has involved complicated schemes requiring the repeated, iterative division and subdivision of a single microwave channel, with attendant losses at each and every level of the hierarchy of subdivision.

Moreover, the practical recognition of the possibilities of solid state technology including the use of IMPATT and other negative resistance diodes has been lagging and unfulfilled in the millimeter wavelength domain, especially with respect to microstrip applications.

Accordingly, it is an object of the instant invention to develop a workable microwave power combiner cavity employing IMPATT diode technology to provide an advanced component or device for application in radar systems.

It is an object of the invention to develop a microwave power combiner cavity which has the configuration of a resonant ring or circle employing IMPATT or other negative resistance diode elements in symmetrical cooperation with the ring.

It is an object of the invention to provide a power combining cavity in a configuration which minimizes the excitation of spurious operating modes.

It is an object of the invention to improve the signal fidelity, output amplitude stability and combining efficiency of IMPATT or other negative resistance diode power combiners operating in the millimeter wavelength region.

DISCLOSURE OF INVENTION

The invention herein is directed to a microwave power combiner for operation as a coherent microwave amplifier.

The combiner is structurally arranged to include a metallic shielding case effective for containing microwave energy capacitively coupled into and out of a ring resonator.

The shielding case encloses and shields a dielectric waveguide microstrip structure which is coupled to an external microwave power source.

For example, in a Ku band application, the power is capacitively coupled to an etched copper pattern on a dielectric substrate, which in turn transfers the power to a ring shaped copper resonator having a circumference which is an integer multiple of a half wavelength in the desired operating mode at the desired frequency.

The IMPATT or other negative resistance diodes are mounted in the metallic shielding case and act to amplify the power in the ring microstrip cavity, effectively increasing it for retransmission into the divider microstrip, which now acts as a combiner.

The output power is finally retransmitted by capacitive coupling and returned in amplified condition to the coaxial waveguide which serves as both the input and output power port.

BRIEF DESCRIPTION OF THE DRAWING

The invention may best be understood by reference to a drawing which is provided in several figures, wherein.

BEST MODE FOR CARRYING OUT THE INVENTION

Figure 1:
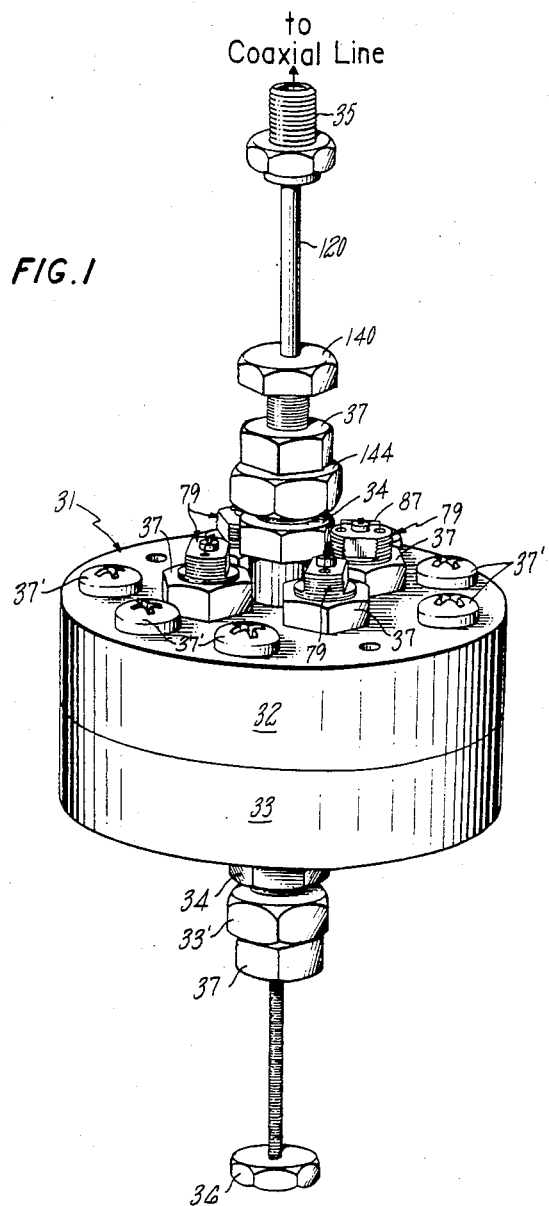
FIG. 1 shows the structure of an actual embodiment of the invention including its outer metallic shielding case and the external connections for the IMPATT diodes which amplify the power level in the ring resonating cavity described herein.

FIG. 1 shows the microwave combiner device including a metallic shielding case or cylinder 31 including an upper and lower portion, respectively 32 and 33. The Figure additionally shows a coaxial waveguide connection 35 for input and output of microwave energy and a shunt tuner 36 for controlling the input impedance to the combiner device. The upper and lower portions 32 and 33 are held together by suitable threaded screws 37'.

Figure 2:
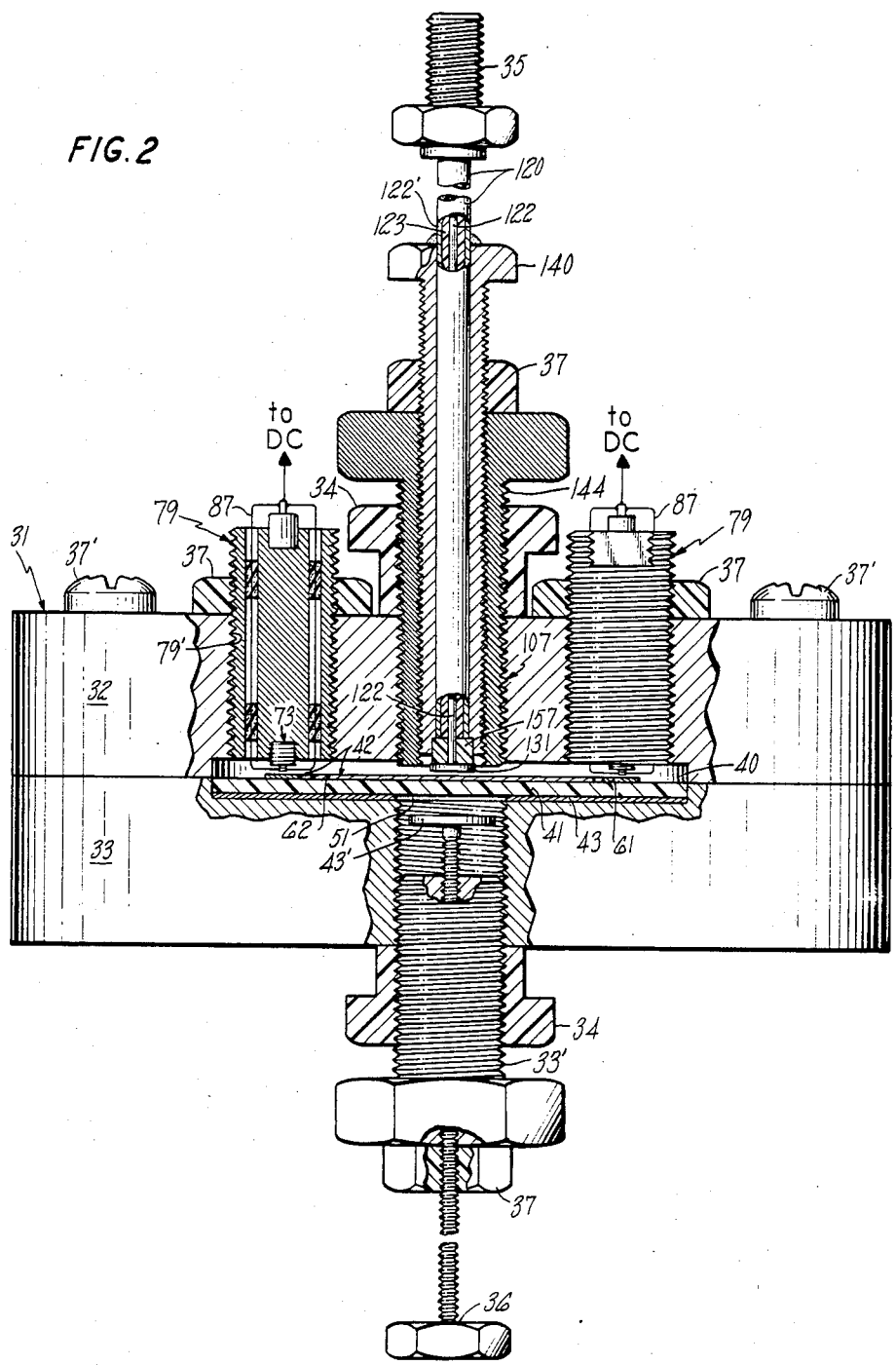
FIG. 2 shows an axial cross section of the metallic shielding case of FIG. 1.

The shielding cylinder 31 defines an internal chamber 40 shown in FIG. 2 for mounting an etched dielectric disc or substrate 41 as shown in the axial cross section.

The substrate 41 is mounted in either the top or the bottom portion of chamber 40, and it includes conductive, e.g., copper surfaces, respectively 42 and 43, on the upper and lower sides therof.

The lower conductive surface 43 of the substrate 41 serves as a ground plate for the microwaves forming within the chamber 40 and defines a removed central portion or hole through which reentrant shunt tuner portion 43' can be raised and lowered with respect to substrate 41 by manually turning reentrant shunt tuner extension 36 which is in turn threadedly mounted in a threaded, axial hole in a cylindrical threaded piece 33', which is in turn mounted in the lower portion 33 of the shielding cylinder 31. The axial position of threaded piece 33' is set with Teflon ® jam nut 34; and the position of extension 36 is set with a similar jam nut 37. In a similar vein, the axial position of threaded annular piece 144 inserted in an axial hole of upper portion 32 is set with a jam nut 34; and that of piece 140 which is threadably insertable into the annulus of piece 144 is set with jam nut 37, as will be seen below. The lower conductive surface 43 preferably covers most of the underside of the disc-shaped substrate 41, with the exception of a centrally disposed disc-shaped region 51 which is etched away to expose the dielectric material of the substrate 41 within, enabling the impedance tuning operation of shunt tuner 36.

The upper conductive surface 42 includes retained metallic, preferably copper surfaces of two kinds after the etching process: a first surface which constitutes the actual ring resonator 61 and which has an inner and outer diameter; and a second surface within the first, but not in electrical contact therewith, which acts as an input/output coupling surface 62 for the overall device.

FIG. 2 additionally shows IMPATT diode assemblies 79 depicted in more detail in FIG. 4 to be discussed below. Each assembly 79 directs DC power from an external source through suitable leads 87 to an IMPATT diode or a similar device 73 which is effective for amplifying the power level in conductive surface 62.

FIGS. 3A-3D show several schemes for establishing a useful pattern of respective upper conductive surfaces 61 and 62. As shown, the central coupling surface 62 can couple microwave power to and from outer conductive surface 61 through several legs 65 which are directed toward integer multiple half wavelength spaced positions along the circumference of the ring, which represent local voltage maxima.

Amplification of the energy in these patterns can be accomplished by suitably capacitively coupling IMPATT diodes 73 or other negative coefficient of resistance diodes with respect to the resonant ring surface 61. In the embodiment constructed, the diodes are directed perpendicularly to the planar surface of surface 61.

In FIGS. 3A-3D, this is substantially indicated by IMPATT diodes 73 arranged radially outward from the resonant surface 61.

IMPATT diodes 73 generate a considerable amount of heat, which must be removed from the microwave combiner to permit effective continued operation. During typical operation the diodes can be provided with DC power in either constant or pulsed form.

As FIGS. 3A-3D show, the preferred embodiments of the invention employ for example three or four coupling legs 65 for the central surface 62. Correspondingly, three or four respectivly associated IMPATT diodes can be employed in amplification at the same waveform nodes.

Alternatively, additional diodes can be interposed at further maxima which occur at the half wavelength positions as well. This doubles the total number of IMPATT diodes from 3 or 4 to 6 or 8, as the case may be, and effectively increases the level of power amplification. In a similar vein, interleaved legs 65 can be provided to the half wavelength power nodes as well.

Figure 3A:
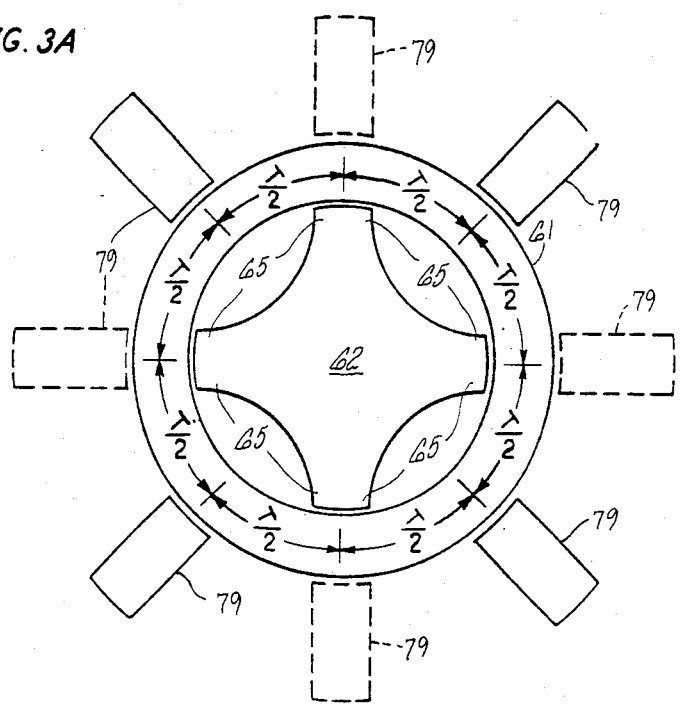
FIG. 3A schematically shows one version for carrying out the invention, in which eight IMPATT diodes are arranged about the resonating cavity or ring resonator and the input/output coupler has four legs.
Figure 3B:
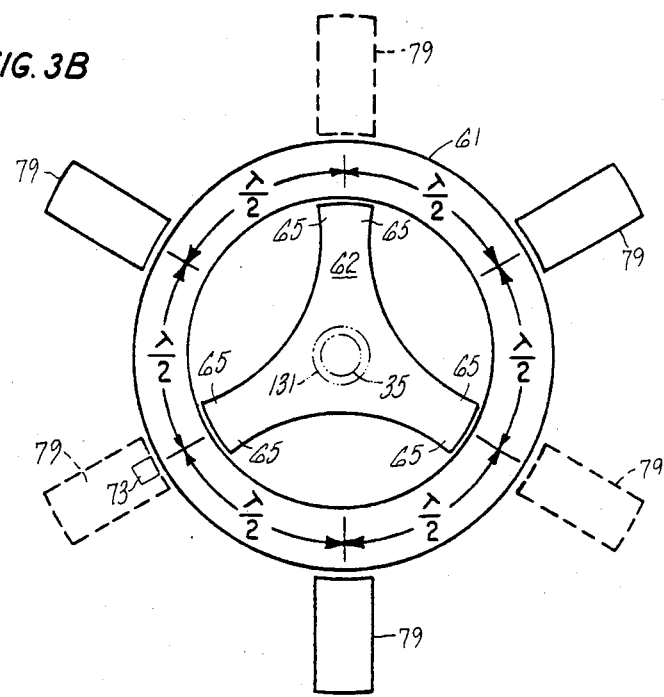
FIG. 3B schematically shows another version of the invention, this time employing a three-legged input/output coupler and an arrangement of six diodes about the resonating ring.
Figure 3C:
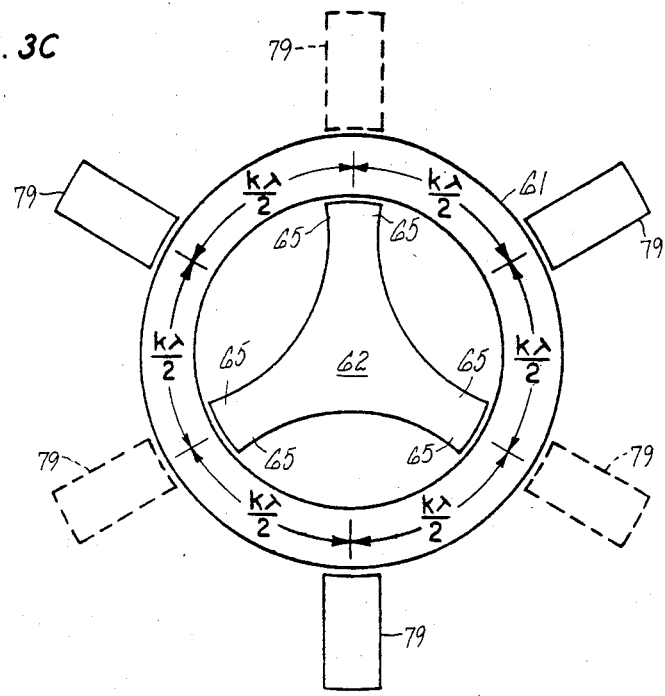
FIG. 3C shows even another version of the invention, which is essentially an overmoded version by factor K of FIG. 3B.
Figure 3D:
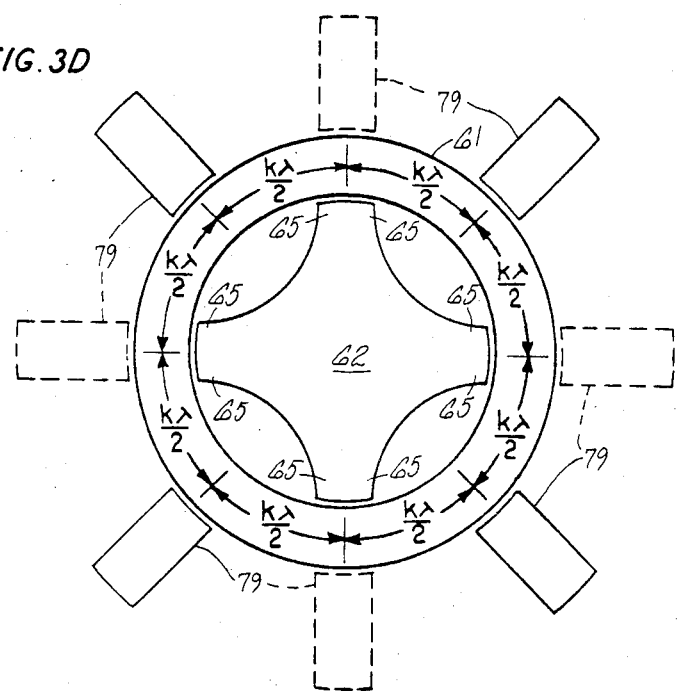
FiG. 3D in turn shows an overmoded version of FIG. 3A.

FIGS. 3C and 3D show overmoded versions of the embodiments shown respectively in FIGS. 3A and 3B. This is indicated to show that the invention is applicable to higher frequencies which are positive integer multiples of the frequencies for which a particular embodiment has been constructed.

The respective IMPATT diodes 73 in the embodiment are each mounted in respective cylindrical assemblies 79, as indicated schematically in FIG. 2. Each assembly 79 is threadably inserted into a spaced receiving hole 79' indicated in FIG. 2 in the block of main cylinder 31. These holes 79' are parallel to the axis of the main cylinder 31.

Figure 4:
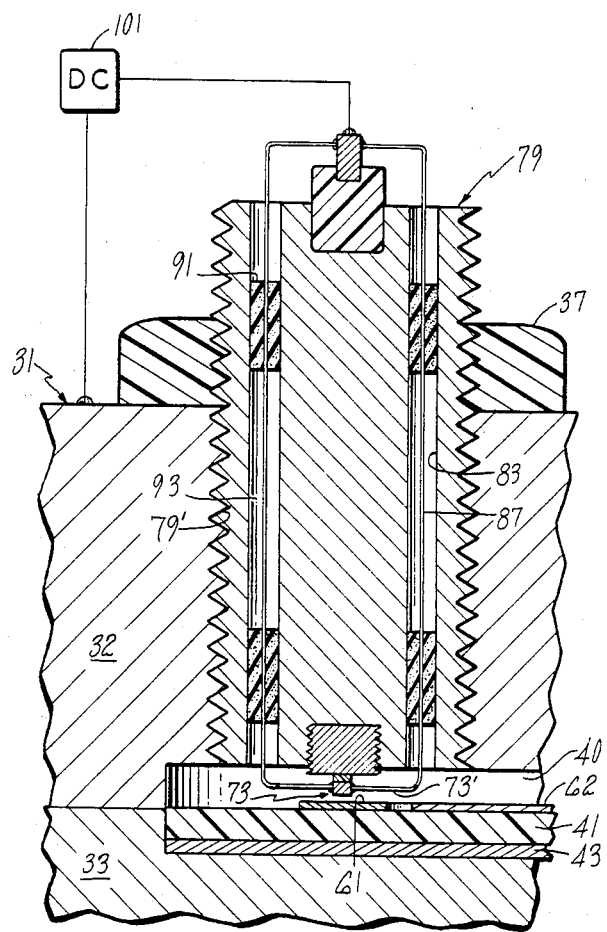
FIG. 4 shows an axial cross section of a single IMPATT diode assembly.

An axial cross section of pertinent portions of a preferred embodiment of the IMPATT diode assembly 79 is shown in FIG. 4. The assembly is threadedly mounted in block 31 and secured with a Teflon ® jam nut 37.

In particular, each diode assembly 79 defines feed-through apertures 83 permitting passage therethrough of insulated DC current leads 87. These leads 87 may for example be constructed of magnet wire including an insulative layer of Kapton ® as thin as 0.001 to 0.002 inches. The apertures 83 are parallel to the axial direction of the assembly 79 and are preferably equally spaced from and symmetrically located with respect to the center of the assembly 79.

The DC power leads 87 extend through feed-through holes 83 to supply each IMPATT diode 73 with a driving current for useful operation. The leads 87 are spaced from the sides of the feed-through aperture 83 by a suitable quarter wavelength of material such as for example conductive rubber.

It is known of course that a quarter wavelength distance varies with the dielectric constant of the propagating medium. Accordingly, the length 91 of the conductive rubber shown in FIG. 4 is considerably less than the length of the air section employed in the same Figure as a dielectric insulator at other portions of the aperture 83, for example near the center 93 of the aperture 83. It follows that the microwave impedance is determined by the dielectric constant and thickness of the insulative layer on the magnet wire which is adjacent to the conductive rubber.

By having alternate quarter wave sections of low and high characteristics, microwave energy cannot propagate on DC leads 87. However, the flow of DC power nonetheless continues.

The alternating high and low impedance quarter wave sections thus established along each of DC leads 87 accordingly act as a reflective filter from the microwave energy in cylinder 31.

The IMPATT diode 73, as for example commercially available from Varian Corporation or Microwave Associates, has leads 73' of its own, which are suitably electrically connected to the DC leads 87 extending through the diode assembly 79.

The DC leads 87 extend from the diode assembly 79 to a suitably controllable DC power supply 101 or to a suitable pulse generator for driving the IMPATT diode 73.

The threaded insertion of the diode assemblies 79 in block 31 permits the diode 73 to be selectively positioned as close as needed for effective capacitive coupling to resonant ring surface 61.

Microwave power is coupled to and from the device suitably coupled for example by threaded joinder by connector 35 to a coaxial line (not shown) as indicated in FIG. 1. The power then passes to power coupling assembly 107 through a coaxial transmission line 120 including a center conductor 122 and insulative dielectric material 123 as shown in FIG. 2, and an outer conductor 122'. The microwave power is thus delivered to a conductive horizontal disc 131 connected to center conductor 122 within chamber 40.

More particularly, the power coupling assembly 107 includes a central threaded element 140, and an outer doubly threaded annular piece 144 within which the central threaded element 140 is adjustably positionable. The outer conductor 122' is suitably soldered, brazed or otherwise joined with central threaded element 140.

The capacitive power coupling disc 131 suitably joined at the end of central conductor 122 is electrically insulated from central threaded element 140 by a suitable insulative cylindrical piece 157. The central conductor 122 of the coaxial tube 120 is fixedly mounted in an aperture defined along the axis of the central threaded element 140.

The disc 131 can thus be positioned adjustably with respect to the central coupling surface 62 of substrate 41 in order to promote effective capacitive coupling, i.e., impedance matching, of microwave power to resonant ring surface 61.

This positioning can be done in two ways: by threaded movement of the outer annular piece 144 or by threaded movement of central element 140.

Capacitive coupling can thus be accomplished in several adjustments.

The relative motion of outer annular piece 144 to the inner piece 140 thus adjusts the series inductance of the input coupling system. This effectively promotes impedance matching operating between disc 131 and surface 62.

Furthermore, capacitive coupling and impedance matching is accomplished by turning extension 36 to position shunt tuner 43 with respect to substrate 41. A further tuning or capacitive coupling effect is accomplished by the degree of insertion of threaded piece 33' in lower portion 33.

Finally, it is clear that reentrant tuning by extension 36 and the coupling of microwave power through assembly 144 can also be accomplished by feeding microwave power through lower portion 33 and performing reentrant tuning through upper portion 32.

I claim:

1. A microvwave power combining device comprising:
   a cylindrical chamber (40) having an axis;
   a disc-like dielectric substrate (41) disposed coaxially within the chamber (40) and having an upper surface (42) and a lower surface (43);
   a first conductive surface (62) disposed on the upper surface (42) of the substrate (41) and centered about the axis;
   a second conductive surface (61) in the form of a ring disposed about the first conductive surface (62) on the upper surface (42) of the substrate (41), and centered about the axis;
   input/output means (35) for connecting to a source of microwave energy; and
   coupling means (131) disposed normal to the axis for coupling microwave energy between the input/output means (35) and the conductive surface (62);
   wherein the first conductive surface (62) includes a plurality of legs (65) extending towards the second conductive surface (61) interior the second conductive surface (61) at regularly spaced intervals with respect to the second conductive surface (61) corresponding to an integral multiple of half wavelengths of the microwave energy; and
   further comprising a first plurality of negative resistance means (73) disposed about the second conductive surface (61) exterior the second conductive surface (61) at regularly spaced intervals opposite the legs (65), and capacitively coupled to the second conductive surface (61) for amplifying the power level in the second conductive surface (61).

2. Apparatus according to claim 1 further comprising a second plurality of negative resistance means (73) disposed about the second conductive surface (61) exterior the second conductive surface (61) at regularly spaced intervals between the first plurality of negative resistance means (73), and capacitively coupled to the second conductive surface (61).

3. Apparatus according to claim 1 further comprising:
   a third conductive surface disposed on the lower surface (43) of the substrate (41) defining a disc with a central hole portion coaxial with the axis; and
   a grounded, electrically-conductive, disc-like element (43') adjacent the central hole portion of the third conductive surface and axially adjustable with respect thereto.

4. Apparatus according to claim 1 further comprising:
   a plurality of assemblies (79), each assembly (79) associated with one negative resistance means (73), wherein each assembly defines an aperture (83) having a lead (87) passing therethrough and connected to the associated negative resistance means (73), and wherein the lead (87) is supported within the aperture (83) by alternate quarter wave sections of low and high dielectric constant so that the micowave energy cannot propagate on the lead (87).

* * * * *